(12) United States Patent
Castaneda

(10) Patent No.: US 7,597,231 B2
(45) Date of Patent: Oct. 6, 2009

(54) WIRE BONDING CAPILLARY TOOL HAVING MULTIPLE OUTER STEPS

(75) Inventor: Jaime Castaneda, Sunglade Condominium (SG)

(73) Assignee: Small Precision Tools Inc., Petaluma, CA (US)

( * ) Notice: Subject to any disclaimer, the term of this patent is extended or adjusted under 35 U.S.C. 154(b) by 499 days.

(21) Appl. No.: 11/400,927

(22) Filed: Apr. 10, 2006

(65) Prior Publication Data

US 2007/0235495 A1 Oct. 11, 2007

(51) Int. Cl.
*B23K 37/00* (2006.01)
(52) U.S. Cl. .................. 228/4.5; 228/110.1; 228/180.5
(58) Field of Classification Search ................. 228/4.5, 228/110.1, 180.5
See application file for complete search history.

(56) References Cited

U.S. PATENT DOCUMENTS

| | | | |
|---|---|---|---|
| 5,503,321 A | 4/1996 | Urushima | |
| 5,884,835 A | 3/1999 | Kajiwara et al. | |
| 6,321,969 B1 | 11/2001 | Miller | |
| 6,523,733 B2 * | 2/2003 | Miller et al. | 228/4.5 |
| 6,910,612 B2 | 6/2005 | Perlberg et al. | |
| 2002/0033408 A1 | 3/2002 | Miller et al. | |
| 2003/0146267 A1 | 8/2003 | Mayer et al. | |
| 2004/0188499 A1 | 9/2004 | Nosaka | |
| 2005/0252950 A1 | 11/2005 | Eder et al. | |
| 2005/0275073 A1 | 12/2005 | Kawakami et al. | |

FOREIGN PATENT DOCUMENTS

GB 2 285 943 A 8/1995
JP 9-260416 * 10/1997

* cited by examiner

*Primary Examiner*—Jessica L Ward
*Assistant Examiner*—Nicholas P D'Aniello
(74) *Attorney, Agent, or Firm*—Vincent K. Gustafson; Intellectual Property/Technology Law

(57) ABSTRACT

A bonding tool for bonding a fine wire to a substrate, said bonding tool comprising an at least substantially cylindrical portion having a concentric capillary therein through which the fine wire runs; a working tip portion formed at an end of the cylindrical portion being tapered towards the tip thereof, said working tip portion having an annular chamfer at the tip thereof; wherein the concentric capillary opens into the annular chamfer of the working tip, and wherein the diameter of the cylindrical portion decreases consecutively at a plurality of discrete intervals along the length of the cylindrical portion towards the working tip portion.

26 Claims, 12 Drawing Sheets

PRIOR ART

Figure 10

| Bonding Tool | Amplitude Displacement at the Transducer (nm) | Amplitude Displacement at the Tip (nm) | Amplification Ratio |
|---|---|---|---|
| Conventional | 203 | 450 | 2.22 |
| 2 Steps | 184 | 684 | 3.70 |
| 3 Steps | 206 | 636 | 3.08 |
| 4 Steps | 211 | 648 | 3.07 |

PRIOR ART

WIRE BONDING CAPILLARY TOOL HAVING MULTIPLE OUTER STEPS

TECHNICAL FIELD

The present invention relates to the field of wire bonding capillary tools for bonding a fine wire to a substrate, and more specifically, to a wire bonding capillary tool having a high impedance values and being optimized for ultrasonic energy transfer compliancy.

BACKGROUND

Printed circuit boards (PCB) are commonly used in the manufacture of digital devices, automated testing equipment (ATE) and in a range of general electronic equipment. Each PCB has a variety of electronic components mounted thereon. Examples of such components include semiconductor chips, integrated circuits (IC), resistors, transistors and capacitors. The electrical connection between each mounted component and the PCB (which may also be referred to as a substrate), is commonly taken to be part of the semi-conductor packaging process and is of paramount importance. An improper or faulty electrical connection between the electrical component and the PCB is likely to result in the functional failure of the device or equipment in which the faulty connection occurs.

Amongst the above-mentioned components that are commonly mounted onto a PCB, the IC may be considered to be one of the most important. In mounting the IC onto the PCB, manufacturers have typically relied on three techniques, namely, wire bonding, tape automated bonding (TAB) and flip-chip mounting technology. Amongst the three techniques of mounting an IC, wire bonding is the most commonly used method. In wire bonding, the PCB (or substrate) has a plurality of bonding pads situated thereon in a predetermined pattern. The IC, having electrical leads, is typically mounted in the center of the predetermined pattern of bonding pads and its electrical leads are then connected to the bonding pads. The electrical connections between the IC and the PCB are established by using either copper, gold or aluminum wires having diameters typically between the range of about 10-about 200 microns, depending upon the requirements of the circuit and bond pad size. The wires are usually attached with one end to the electrical lead of the mounted IC, then drawn towards the respective bonding pad, and are finally attached to the appropriate bonding pad thereby establishing an electrical connection between the substrate and the IC mounted thereon.

The establishment of the electrical connection between the mounted IC and its respective substrate, as described above, is carried out by a bonding tool. The bonding tool supplies the fine wire and employs a method known as ball bonding to electrically connect the electrical leads of the IC to the bond pads of the substrate. The bonding tool comprises a capillary through which the fine wire is threaded through. The capillaries are typically made from a ceramic material such as aluminum oxide, tungsten carbide and aluminum toughened zircon, for example. An example of such a conventional wire bonding tool is described in U.S. Pat. No. 6,910,612. This U.S. patent describes a bonding tool having a cylindrical axial passage coupled to a working tip having an inner annular chamfer. The annular chamfer has a predetermined angle and face length, which essentially go towards shaping the ball bond during the bonding process.

The process of wire bonding involves having the wire threaded through the capillary and leaving a free end of the wire at the working tip of the capillary. The free end of the wire at the working tip of the capillary is the end that forms the ball for ball bonding, which is a form of wire bonding. As an exemplary illustration, when a gold fine wire is used, the process is known as gold ball bonding. During gold bond bonding, a gold ball is first formed by melting the end of the wire at the capillary tip through electronic flame-off (EFO). This gold ball, which is generically known as a free-air ball, typically has a diameter ranging from 1.5 to 2.5 times that of the wire diameter. The free-air ball size consistency is controlled by the EFO. The free-air ball is then brought into contact with the bond pad of the substrate or the electrical lead of the mounted IC. When the free-air ball contacts the bond pad, for example, adequate amounts of pressure, heat, and ultrasonic forces are then applied to the ball bond for a specific amount of time, thus forming the initial metallurgical weld between the ball and the bond pad, as well as deforming the ball bond itself into its final shape. The wire is then run to the electrical lead corresponding to the bond pad to create a gradual arc or "loop" between the bond pad and the electrical lead. Pressure and ultrasonic forces are applied to the wire to form the second bond (known as a wedge bond, or stitch bond) with the electrical lead in order to complete one bonding cycle.

With regard to the application of ultrasonic energy, the effect of such energy causes the bonding tool, in particular, the tip of the capillary, to oscillate. Accordingly, when ultrasonic energy is applied to the bonding tool after the ball bond is formed, the bonding tool, in effect, scrubs the ball bond against the bond pad. This scrubbing action cleans the bond pad, which is typically aluminum, of debris and oxides, such as aluminum oxide, for example. This scrubbing action exposes a fresh surface of the bond pad in the process. The metallurgical bond or weld between the ball bond and the bond pad is further enhanced with the continued application of ultrasonic energy, resulting in plastic deformation of the ball bond and bond pad against each other. Aside from the physical contact and deformation of the metals unto each other, inter-diffusion of the ball bond and bond pad metal atoms also occurs, which further enhances the metallurgical bond. In general, bond reliability increases with the level of inter-diffusion that takes place. The most common reason for insufficient inter-diffusion is the presence of foreign materials or contaminants on the surface of the bond pad, such as oxides, unetched glass, silicon saw dust, and process residues, for example. The importance of the application of sufficient ultrasonic energy to achieve a reliable bond is underscored by the need to also ensure that the bond pad is free of contaminants.

Presently, there is a growing trend in the semiconductor industry to use materials having sensitive metallization such as materials with low dielectric constants (low K value), for example. Materials having a sensitive metallization also include ultra-thin bond pads. Generally, materials with such sensitive metallization have poor mechanical properties, low thermal conductivity and are more susceptible to metal peel-off, cratering and oxide cracks during wire bonding.

Another growing trend in the industry is the carrying out of 'bonding over active circuitry'. This requires a stable wire bonding process especially since 'bonding over active circuitry' essentially involves forming a metal bond pad with a metal layer thereon over circuitry in the semiconductor chip.

Bonding tools, where the amount of combined mechanical stress from the applied ultrasonic energy, impedance and the impact force of said bonding tool on the bond pad may result in serious damage occurring to the bond pads with sensitive metallization. Furthermore, such conventional bonding tools may not be able to form bonds reliable enough for carrying out 'bonding over active circuitry'.

Typically, when a conventional bonding tool, such as that described in the aforesaid U.S. Pat. No. 6,910,612, is used in conjunction with a substrate of a low K value, the ultrasonic energy delivered at the working tip of conventional bonding tools is usually insufficient to bond low K bond pads through metallization. The working tip of the conventional capillary requires higher power ultrasonic settings to bond sufficiently with a bond pad of low K value. However, if a higher ultrasonic energy is supplied, it tends to further aggravate the above-mentioned problems of metal peel-off, cratering and oxide cracks.

In response to the above-mentioned problem concerning materials having a low-K value, U.S Pat. No. 6,321,969 discloses a wire bonding tool that is capable of a more efficient transfer of ultrasonic energy from the ultrasonic source to the working tip of the tool. As mentioned above, apart from scrubbing oxide of a bond pad, the oscillating action of the working tip, when ultrasonic energy is applied to it, aids in the inter-diffusion of the bond and bond pad metal atoms thereby further enhancing the metallurgical bond. Accordingly, U.S. Pat. No. 6,321,969 discloses that if a more efficient transfer of ultrasonic energy to the working tip takes place, a lower amount of said ultrasonic energy may then be applied to oscillate the working tip, thereby avoiding the aforesaid difficulties associated with bonding materials having a low-K value.

However, there is still a need for a wire bonding tool capillary that is capable of forming reliable wire bonds with substrates having sensitive metallization, and for carrying out 'bonding over active circuitry'. There is also a concurrent need for the bonding tool to be easily integrated into existing wire bonding facilities and to be cost-effective as well. In this respect, the wire bonding tool as described in detail hereafter overcomes the aforesaid difficulties.

SUMMARY

Therefore, in one aspect, the present invention provides a bonding tool for bonding a fine wire to a substrate. This bonding tool comprises an at least substantially cylindrical portion having a concentric capillary therein through which the fine wire runs; a working tip portion formed at an end of the cylindrical portion being tapered towards the tip thereof. The working tip portion having an annular chamfer at the tip thereof; wherein the concentric capillary opens into the annular chamfer of the working tip; and wherein the diameter of the cylindrical portion decreases consecutively at a plurality of discrete intervals along the length of the cylindrical portion towards the working tip portion.

In another aspect, the present invention provides a bonding tool for bonding a fine wire to a substrate. This bonding tool comprises an at least substantially cylindrical portion having a concentric capillary therein through which the fine wire runs; a working tip portion formed at an end of the cylindrical portion being tapered towards the tip thereof. The working tip portion having an annular chamfer at the tip thereof; wherein the concentric capillary opens into the annular chamfer of the working tip; and wherein the diameter of the cylindrical portion decreases consecutively at a first and second discrete interval along the length of the cylindrical portion towards the working tip portion. The discrete intervals each comprise a step, a tapering and any one combination thereof towards the longitudinal central axis of rotation of the cylindrical portion.

In yet a further aspect, the present invention provides a bonding device for forming a metallurgical bond between a fine wire and a bonding substrate. The bonding device comprises a bonding tool for bonding a fine wire to a substrate. This bonding tool comprises an at least substantially cylindrical portion having a concentric capillary therein through which the fine wire runs; a working tip portion formed at an end of the cylindrical portion being tapered towards the tip thereof. The working tip portion having an annular chamfer at the tip thereof; wherein the diameter of the cylindrical portion decreases consecutively at a plurality of discrete intervals along the length of the cylindrical portion towards the working tip portion. The bonding device also comprises a nanoscale ultrasonic energy source connected to said bonding tool such that said source is capable of transmitting ultrasonic energy to the bonding tool.

These and other features of the invention will be better understood in light of the following drawings and detailed description.

BRIEF DESCRIPTION OF THE DRAWINGS

FIG. 10 shows a comparison table for the amplitude displacement ratio of a conventional bonding tool against bonding tools (FIGS. 2, 3, and 4) having a plurality of discrete intervals.

DETAILED DESCRIPTION

Figure 1:
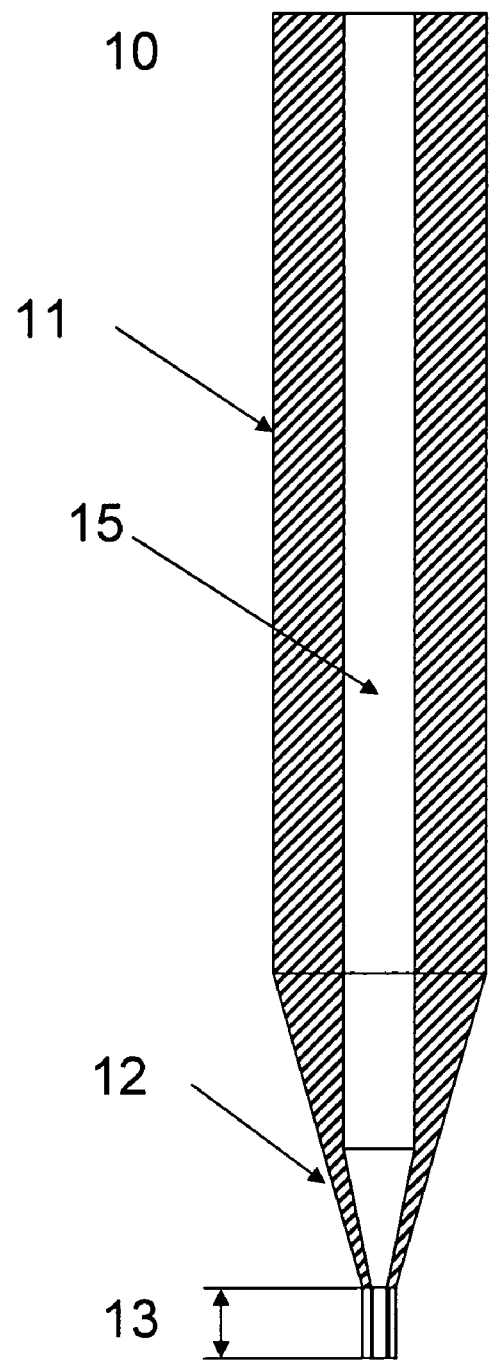
FIG. 1 shows a conventional wire bonding tool.

In one aspect, the bonding tool includes an at least substantially cylindrical portion having a concentric capillary therein through which the fine wire runs. A working tip portion is formed at an end of the cylindrical portion, and is tapered towards its tip. The working tip portion also includes an annular chamfer at the tip thereof where one end of the chamfer opens out to the surroundings and its other end is connected to the concentric capillary, such that said capillary opens into the other end of the annular chamfer within the working tip. The diameter of the cylindrical portion decreases consecutively at a plurality of discrete intervals along the length of the cylindrical portion towards the working tip portion.

Generally, it may be taken that there is no fixed upper limit for the number of discrete intervals that may be present along the length of the bonding tool. In one illustrative embodiment, the diameter of the cylindrical portion decreases consecutively at two discrete intervals. In alternative embodiments, the diameter of the cylindrical portion may decrease consecutively at three, four or five discrete intervals. As there is no upper limit, it may also be possible to have as many discrete intervals as one wishes to have. As such, ten, twenty-five, fifty or even one hundred discrete intervals may be present, provided the length of the bonding tool supports that many discrete intervals.

Typically, the consecutive diametric decrease at each of the plurality of discrete intervals is carried out by way of a step, a tapering, or any combination thereof. The step, tapering or otherwise, is generally directed towards the longitudinal central axis of rotation of the cylindrical portion. This results in a reduction in diameter at each discrete interval of the substantially cylindrical portion over the length of the bonding tool, in the direction of the working tip.

In one embodiment of the invention, the step may essentially be a ninety degree step. In an alternative embodiment, the step is formed out of a plurality of tapers. Each of the plurality of tapers typically occurs towards the central axis. A further alternative embodiment is one where the step is formed in the shape of an arc subtending from a point before the discrete interval (larger diameter) to a point on or after the discrete interval (smaller diameter). The arc may either be concave or convex. Where the diametric reduction is by way of a tapering, the tapering angle may be, but is not limited to, up to about 10 degrees towards the longitudinal central axis of rotation of the cylindrical portion. Variations in the diametric reduction are described in greater detail later in this application with references being made to accompanying FIGS. 6A-6F.

Generally, each successive diametric decrease at each of the plurality of discrete intervals is either substantially of absolutely concentric to each other. The plurality of discrete intervals may either be proportionately or equally distributed over the length of the substantially cylindrical portion provided the overall length of the bonding tool is sufficient to accommodate the number of discrete intervals to be included. The typical length of the bonding tool is, but is not limited to, about 11.10 mm and in certain cases, may vary anywhere between about 9.0 mm to about 20.0 mm in length. The length of the concentric capillary therein and annular chamfer is also between about 9.00 mm to about 20.00 mm. Typically, the concentric capillary may have a diameter less than or equal to about 5.0 mm but greater than or equal to about 80.0 μm.

In a first exemplary embodiment of the invention having two discrete intervals, the first and second discrete intervals along the length of the cylindrical portion are distant from the working tip by about 7.10 mm and by about 2.65 mm, respectively. In this context, the convention for describing the various discrete intervals, which is adhered to throughout the rest of this specification, assumes that the first discrete interval is that which is farthest from the working tip, and the last discrete interval is that which is nearest to the working tip.

Accordingly, in the first embodiment, a diametric decrease takes place at a distance of about 7.10 mm and about 2.65 mm. Since the diametric decreases takes place consecutively in the direction of the working tip, the diameter prior to the first discrete interval, D1 (about 1.587 mm), is greater than the diameter, D2 (about 1.20 mm) thereafter. Accordingly, it follows that the diameter, D2, prior to the second discrete interval is about 1.20 mm and the diameter, D3, thereafter is about 0.82 mm. Therefore, in this embodiment, the diameter decreases in fixed amounts at each discrete interval. That is, at the first discrete interval, the diameter decreases from about 1.587 mm to about 1.20 mm and subsequently, at the second discrete interval, from about 1.20 mm to about 0.82 mm. Two discrete intervals create three distinct diameters over the length of the bonding tool of the first exemplary embodiment.

In a second exemplary embodiment where the bonding tool has three discrete intervals, said three discrete intervals are at about 2.65 mm, at about 5.375 mm and at about 8.10 mm from the working tip. The diameter of the substantially cylindrical portion is greatest at a distance of about 8.10 mm from the working tip and decreases at each subsequent discrete interval towards the working tip. In this embodiment, the diameter is also initially at about 1.587 mm (i.e. just prior to the first discrete interval at about 8.10 mm from the working tip). After the first, second and third discrete intervals, the corresponding diameters are about 1.331 mm, about 1.076 mm and about 0.82 mm, respectively. In this embodiment, three discrete intervals create four distinct diameters over the length of the bonding tool of the second exemplary embodiment.

In a third exemplary embodiment where the bonding tool has four discrete intervals, the four discrete intervals are at about 2.65 mm, about 4.466 mm, about 6.282 mm and about 8.098 mm from the working tip. The diameter of the substantially cylindrical portion is greatest at a distance of about 8.098 mm from the working tip and decreases at each subsequent discrete interval towards the working tip. In this embodiment, the diameter is also initially at about 1.587 mm (i.e. just prior to the first discrete interval at about 8.098 mm from the working tip). After the first, second, third and fourth discrete intervals, the corresponding diameters are about 1.395 mm, about 1.2035 mm, about 1.0118 mm and about 0.82 mm, respectively. In this embodiment, four discrete intervals create five distinct diameters over the length of the bonding tool of the second exemplary embodiment.

As mentioned earlier, the number of discrete intervals along the length of the substantially cylindrical portion may be more than four, i.e. five, six, and seven or even higher numbers of discrete intervals at which a diametric reduction may take place. As a general guideline, the more discrete intervals present, the longer the length of the bonding tool (or substantially circular portion) may have to be. Another general guideline is that if 'n' numbers of discrete intervals are present, then the bonding tool has (n+1) number of different diameters along the length of the bonding tool towards the working tip. Accordingly, the number of diametric reductions up to say about 0.82 mm (which is the lower limit of the diameter of the capillary within the substantially circular portion according to the agreed industrial standard, but it is not limited as such by any technical requirement of the bonding tool) may be predetermined and the required number of discrete intervals calculated based on the aforesaid relationship.

With the reduction in diameter, the latitudinal cross-sectional area of the bonding tool decreases as well. The latitudinal cross-sectional shape of the bonding tool may be polygonal, circular or elliptical. Where the latitudinal cross-sectional shape of the bonding tool is polygonal, the cross-sectional shape may be, but is not limited to being, pentagonal in shape, hexagonal in shape or octagonal in shape, for example.

When in operation, the bonding tool is typically attached (or clamped) to a nano-scale ultrasonic energy transducer. The transducer typically clamps up to about 3.0 mm of the length of the bonding tool. When activated, the transducer transmits ultrasonic energy to the bonding tool. In this respect, the at least substantially cylindrical portion and working tip are adapted so as to be able to undergo an ultrasonic displacement when ultrasonic energy is transmitted to the bonding tool.

During operation, the ratio of the displacement of the working tip portion to the displacement of the transducer is known as the displacement amplification ratio. The working tip of the bonding tool according to the present invention is generally adapted to have a displacement amplitude ratio of at least about three when undergoing ultrasonic displacement. The ultrasonic displacement of the entire bonding tool, including the at least substantially cylindrical portion and working tip, is at least substantially sinusoidal in shape. The sinusoidal shape has its points of 'approximate zero' displacement typically at the same points where the discrete intervals are located. The points at which approximately zero displacement occurs are also referred to as node points.

The effects of the above-mentioned substantially sinusoidal displacement are demonstrated during the actual bonding process. During said bonding process, the bonding tool and the bond pad contact each other with the bonding tool applying a static compressive force to the bond pad causing static pre-deformation thereof. An ultrasonic generator then introduces a signal to a piezoelectric element. The element drives the transducer at a resonant frequency to maximize the displacement motion. The vibrations are amplified and transmitted to the bonding tool, which is attached perpendicular to the axis of the transducer. The vibrating bonding tool applies oscillatory forces parallel to the bond pad surface. This results in a scrubbing motion between the capillary tip and the bond pad and accounts for the ultrasonic deformation of the bond pad.

Simultaneously, the fine wire within the capillary softens upon absorption of the ultrasonic energy and flows under the load breaking up the surface oxides on the bond pad and exposing a fresh surface of the bond pad. The ultrasonic energy also supplies the activation energy required for inter-diffusion between the metal of the bond pad and that of the ball bond during bond formation. The use of ultrasonic energy during the bond formation therefore enhances the diffusion phenomena.

The bonding tool of the present invention may be fabricated from, but is not limited to, metals, ceramics, or ceramic—metal (CerMet) composites, for example. CerMet is a composite material composed of ceramic (cer) and metallic (met) materials). The metal is used as a binder for an oxide, boride, carbide, or alumina. Generally, the metallic elements used are nickel, titanium molybdenum, and cobalt. Examples of ceramics include, but are not limited to, oxides such as alumina, zirconia, or a mixture of both. Further examples of ceramics also include, but are not limited to, non-oxides such as carbides, nitrides and borides. Some specific examples of non-oxide ceramic materials include, but are not limited to, silicium carbide, silicium nitride and silicon carbide. Examples of CerMet composites include, but are not limited to, cobalt bonded tungsten carbide, titanium carbonitride and titanium nitride.

In a particular embodiment of the bonding tool according to the present invention, said bonding tool includes an at least substantially cylindrical portion having a concentric capillary therein through which the fine wire runs. At an end of the at least substantially cylindrical portion, a working tip portion is formed, said working tip portion being tapered towards its tip. The working tip portion has an annular chamfer at the tip thereof with one end of the annular chamfer opening to the environment. The concentric capillary opens into the other end of the annular chamfer of the working tip. In this preferred embodiment, the diameter of the cylindrical portion decreases consecutively at a first and second discrete interval along the length of the cylindrical portion towards the working tip portion. Each discrete interval may include a step, a tapering and any one combination thereof towards the longitudinal central axis of rotation of the cylindrical portion.

In this particular embodiment, the first and second discrete intervals are distanced at about 7.10 mm and about 2.65 mm from the working tip, respectively. At the first and second discrete intervals the corresponding decrease in diameter is from about 1.587 mm to about 1.20 mm and from about 1.20 mm to about 0.82 mm, respectively. Accordingly, and as mentioned earlier, having two discrete intervals gives rise to three different diameters at various points along the length of the bonding tool.

The bonding tool of the present invention may also be utilized in a wire bonding device that forms a metallurgical bond between a fine wire and a bonding substrate. The bonding device includes a bonding tool for bonding a fine wire to a substrate and a nano-scale ultrasonic energy source connected to said bonding tool such that said source is capable of transmitting ultrasonic energy to the bonding tool. Essentially, the bonding tool utilized may be according to any one of the above-mentioned embodiments. In this embodiment of the bonding device, the bonding may be a bond pad or a leadframe, for example.

DETAILED DESCRIPTION OF EXEMPLARY EMBODIMENTS

FIG. 1 illustrates a conventional bonding tool capillary 10 of the prior art. The bonding tool 10 has a cylindrical portion 11, and a tapered working tip portion 12 coupled to the cylindrical portion 11. At the end of the working tip portion 12, working tip 13 is formed. Working tip 13 typically has a chamfer (not shown) which has one end in connection to the capillary 15 and its other end that opens to the environment.

The bonding tool 100 is deficient use in bonding materials having a low-K value due to the susceptibility of said materials to metal lifting, cratering, and metal peel off. The ultrasonic energy delivered at the working tip 13 of conventional bonding tools is insufficient and not optimized to allow for the bonding of low-K bond pads and metallization thereof. The working tip 13 of the conventional capillary 100 requires ultrasonic energy at a higher power than what is typically required. However, using ultrasonic energy at higher than normal levels further aggravates the metal lifting, cratering, and metal peel off problems. Furthermore, the conventional capillary bonding tool 100 cannot provide, at such ultrasonic energy levels, a high level of reliable intermetallic coverage between a deformed ball bond, and a bonding pad. This lack of intermetallic coverage causes excessive aluminum extrusion between the ball bond formed on the bond pad metallization.

Figure 2:
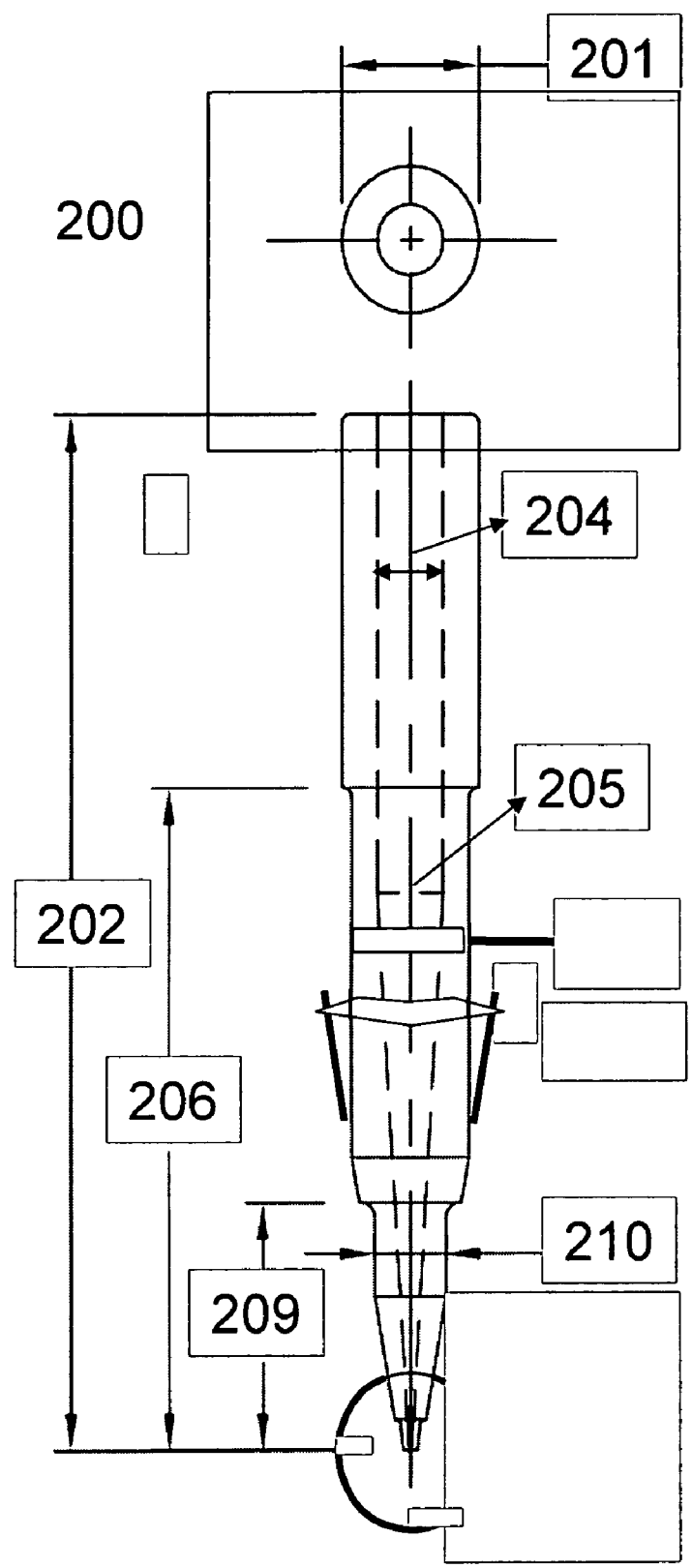
FIG. 2 shows a first embodiment of the bonding tool.

FIG. 2 is the side view of a first embodiment 200 of the invention having two discrete intervals at which a reduction in diameter takes place. As shown in FIG. 2, the bonding tool 200 has a two steps defined by vertical relief 206, and 209. The distances of vertical relief 206 and vertical relief 209 from the working tip are 7.10 mm and 265 mm, respectively. The corresponding outer diameters defined at 201, 207, and 210 are 1.587 mm, 1.20 mm and 0.82 mm, respectively.

The entire length 202 of the capillary is about 11.10 mm. However, as the bonding tool is clamped into an ultrasonic source, only the length 202 is capable of having discrete intervals defined thereon. The capillary 204 tapers at an angle 205 towards the working tip portion 209. In one embodiment, the bonding tool 200 is formed from a unitary piece of material.

Figure 3:
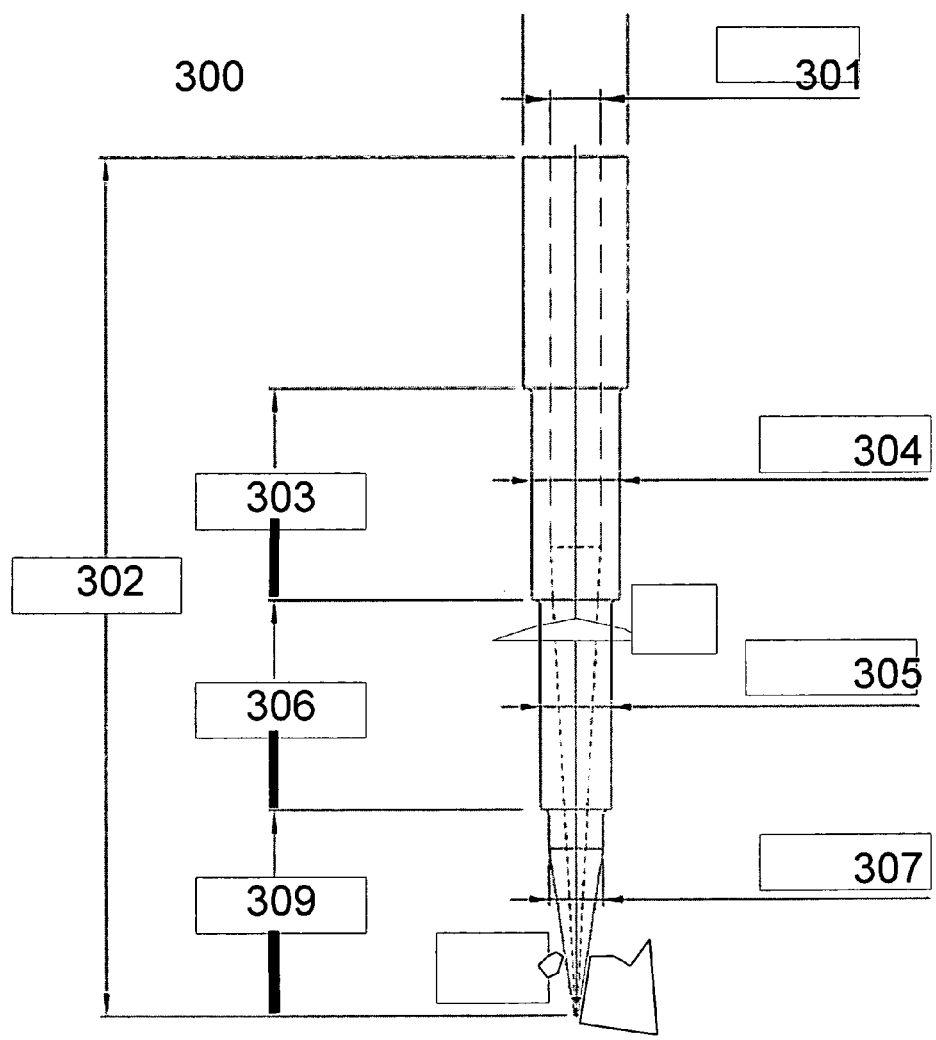
FIG. 3 shows a second embodiment of the bonding tool.

FIG. 3 shows a second embodiment of the bonding tool 300 according to the present invention having three discrete intervals 303, 306, 309 along the entire length of the capillary 302. The diameter of the bonding tool 300 is initially 1.587 mm at 301. After the first discrete interval at 303, the diameter of the bonding tool 300 decreases to 1.331 mm at 304. Subsequently, after the second discrete interval at 306, the diameter of the bonding tool 300 decreases to 1.076 mm at 305. Finally, after the third discrete interval 309, the diameter decreases again to 0.82 mm at 307.

Figure 4:
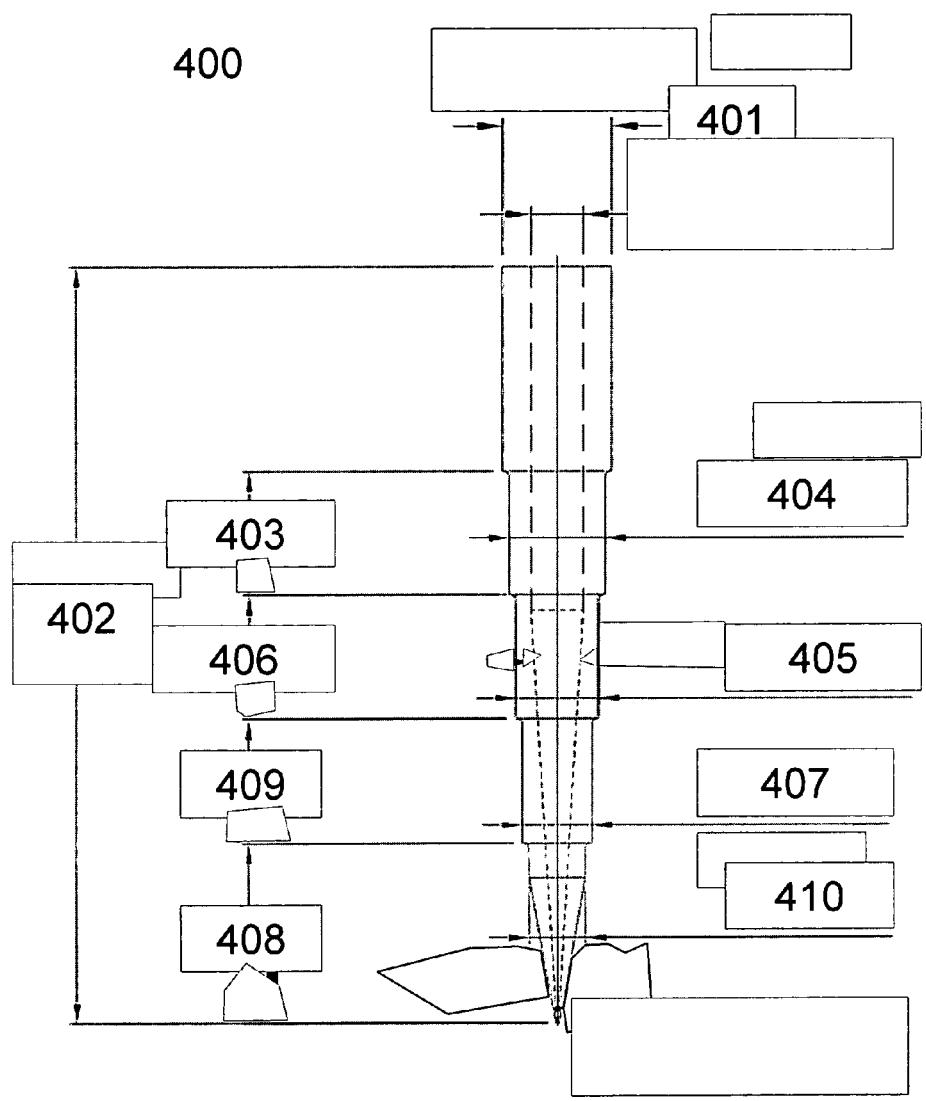
FIG. 4 shows a third embodiment of the bonding tool.

FIG. 4 shows a third embodiment 400 of the bonding tool according to the present invention. The bonding tool 400 has four discrete intervals 403, 406, 408 and 409 along the entire length of the capillary 402. The diameter of the bonding tool 400 is initially at about 1.587 mm at 401. After the first discrete interval at 403, the diameter of the bonding tool 400 decreases to about 1.395 mm at 404. Subsequently, after the second discrete interval at 406, the diameter of the bonding tool 400 decreases to about 1.2035 mm at 405. After the third discrete interval 409, the diameter decreases yet again to 1.0118 mm at 407. Finally, after the fourth discrete interval 408, the diameter decreases for the last time to 0.82 mm at 410.

Figure 5:
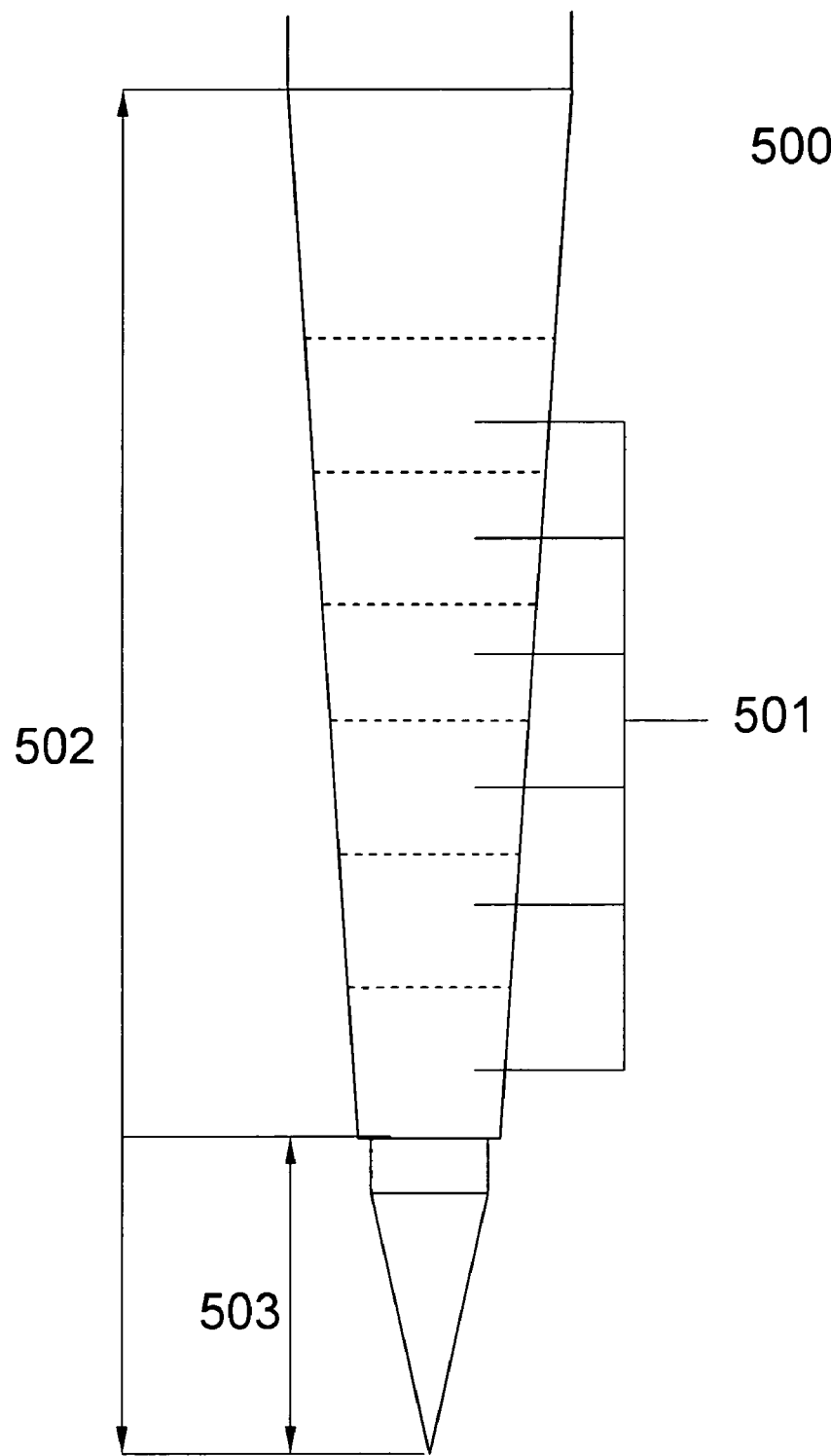
FIG. 5 shows a fourth embodiment of the bonding tool.

FIG. 5 shows a fourth embodiment 500 of the bonding tool according to the present invention. In this embodiment, the length of the bonding tool is denoted by 502. The length 502 is made up of a several consecutively arranged discrete intervals 501 and a working tip portion 503. Each of the discrete intervals 501 achieves its respective diametric decrease by way of a tapering towards the longitudinal central axis of rotation of the bonding tool. The tapering takes place in the direction of the working tip portion 503 and the tapering angle may be up to ten degrees towards the central axis.

Figure 6A:
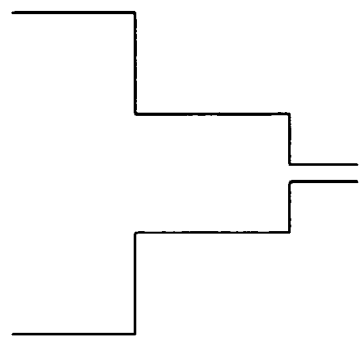
FIGS. 6A-6F show various embodiments of a diametric decrease at a discrete interval.
Figure 6B:
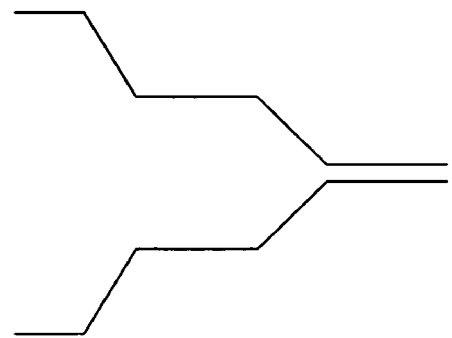

FIGS. 6A-6F show various embodiments of a diametric decrease over two discrete intervals. FIG. 6A shows a step-wise reduction in diameter. The step is at a ninety degree angle to the horizontal at each discrete interval. FIG. 6B shows the diametric decrease being carried out by two tapers at each discrete interval. The angle of the tapers may be equal of vary according to the reduction in diameter to be achieved. As mentioned previously, the tapering is in the direction of the working tip portion (not shown) and towards the central axis.

Figure 6C:
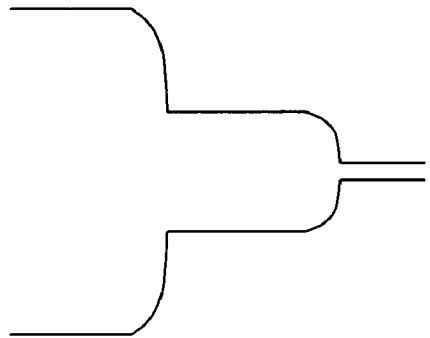
Figure 6D:
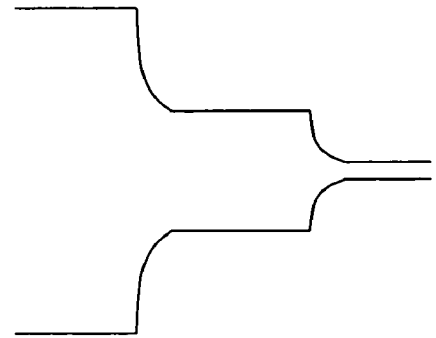
Figure 6E:
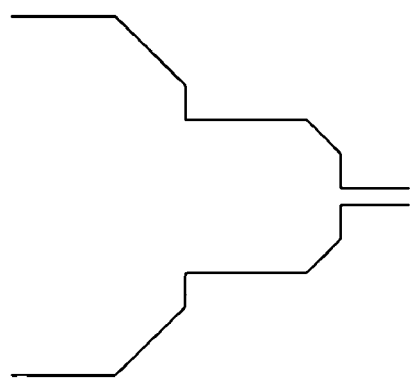
Figure 6F:
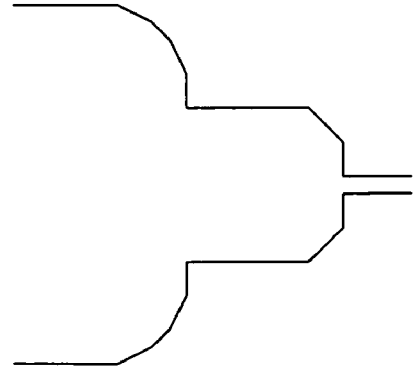

FIG. 6C and 6D shows the diametric reduction being achieved by a step in the form of a convex and concave arc, respectively. FIG. 6E is an embodiment of the diametric reduction being achieved by a combination of a taper, as in FIG. 6B, followed by a step-wise reduction, as in FIG. 6A. The embodiment of FIG. 6F achieves the diametric reduction by having a plurality of tapers. Each of the plurality of tapers is each at a different angle towards the central axis of the bonding tool.

Figure 7:
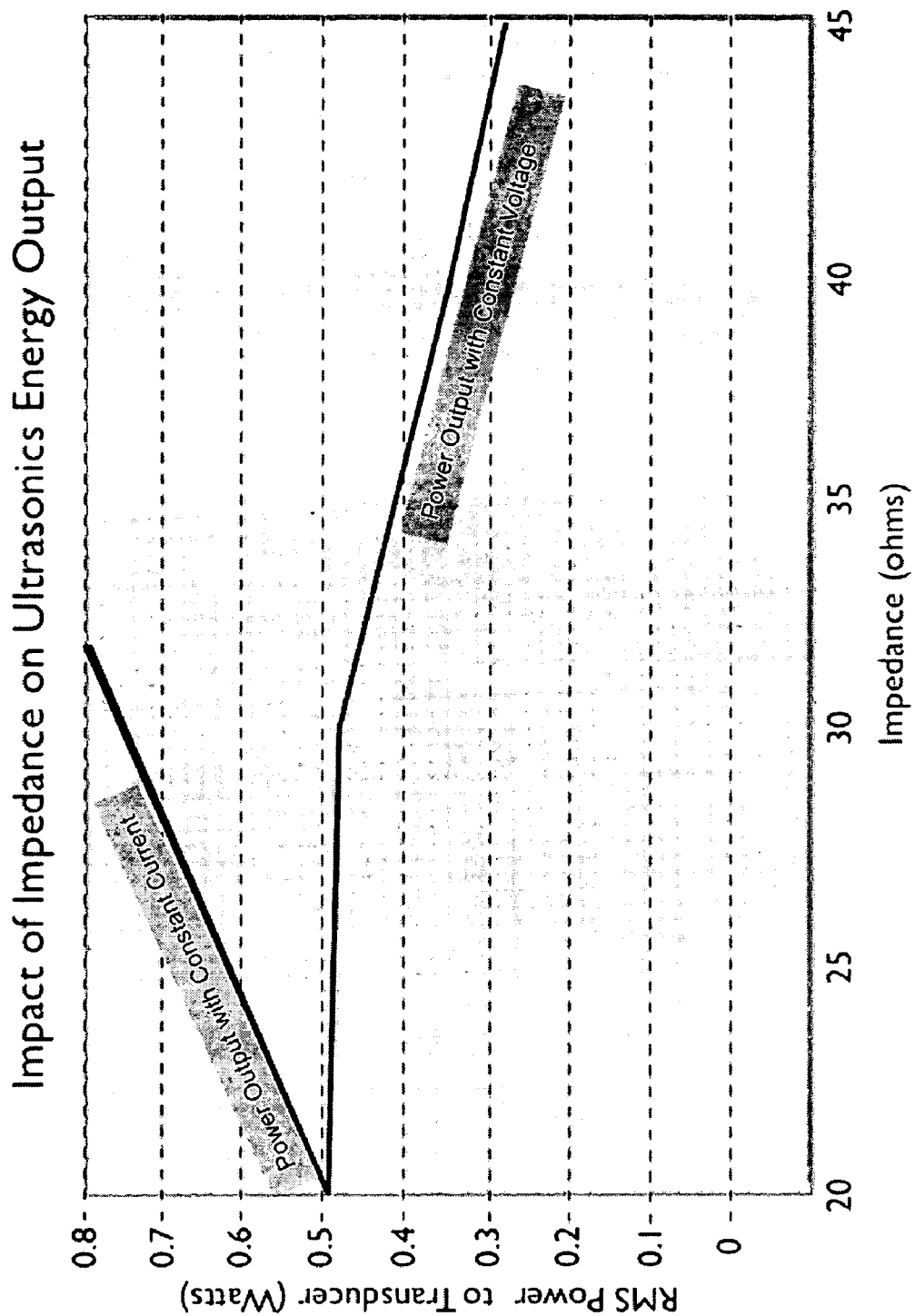
FIG. 7 shows a graph that illustrates the relationship between the input power to a transducer impedance generated therefrom.

FIG. 7 shows a graph that illustrates the relationship between the input power to a transducer and the impedance generated therefrom. In a typical bonding operation, as mentioned above, the bonding tool is clamped to the ultrasonic transducer. As an initial step; a calibration via a power signal analyzer is carried out. The calibration establishes a relationship between the power supplied to the transducer to oscillate the bonding tool between predefined limits, and the impendence generated therefrom by the bonding tool. The actual impedance values are recorded via said power signal analyzer.

From the calibration step, the relationship between the power and the impedance is generally as follows:

As the power delivered (under a constant current) to the bonding tool, via the ultrasonic transducer, increases, the impedance generated, which is dependent on the type of bonding tool used, also increases correspondingly. This relationship is shown in graph of FIG. 7.

Factors that may affect the impedance generated by the bonding tool, when clamped into the ultrasonic transducer, include the design of the bonding tool. As such, each bonding tool is capable of generating different levels of impedance. This is better shown in the comparative bar chart of FIG. 8, which is described in detail below.

Figure 8:
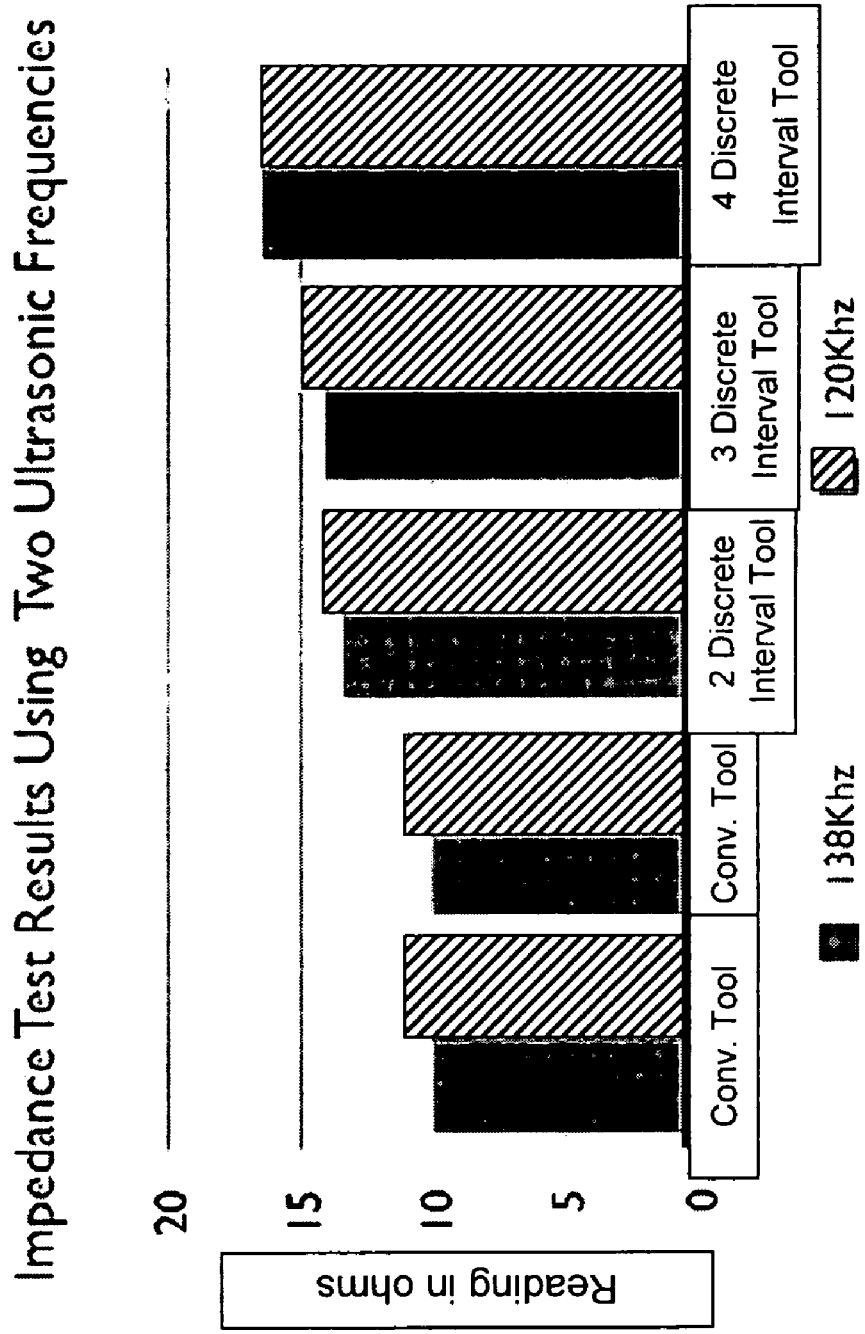
FIG. 8 shows a comparative bar chart between the impedance generated by various bonding tools.

FIG. 8 shows a comparative bar chart between the impedance generated by various bonding tools. The conventional bonding tools generate slightly more than 10 ohms and about 10 ohms at ultrasonic test frequencies of 120 kHz and 138 kHz, respectively. In contrast, bonding tools according to the various embodiments of the present invention, which rely on the above-mentioned relationship between the output power and impedance generation, give significantly different results. These bonding tools, which have discrete intervals present over the length of said bonding tools, give rise to an increase in impedance generation at either of the test frequencies as compared to the conventional bonding tools without such discrete intervals.

Accordingly, it is shown that different (in this case, higher) impedance values may be obtained by varying the design of the bonding tool, such as, for example, by varying the diameter of said tool towards the working tip portion as in embodiments of the present invention. As such, the above-mentioned first, second, third and fourth exemplary embodiments of the present invention typically show a higher impedance value as compared to bonding tools of conventional design, i.e. those lacking discrete intervals along the length of the bonding tool.

Figure 9:
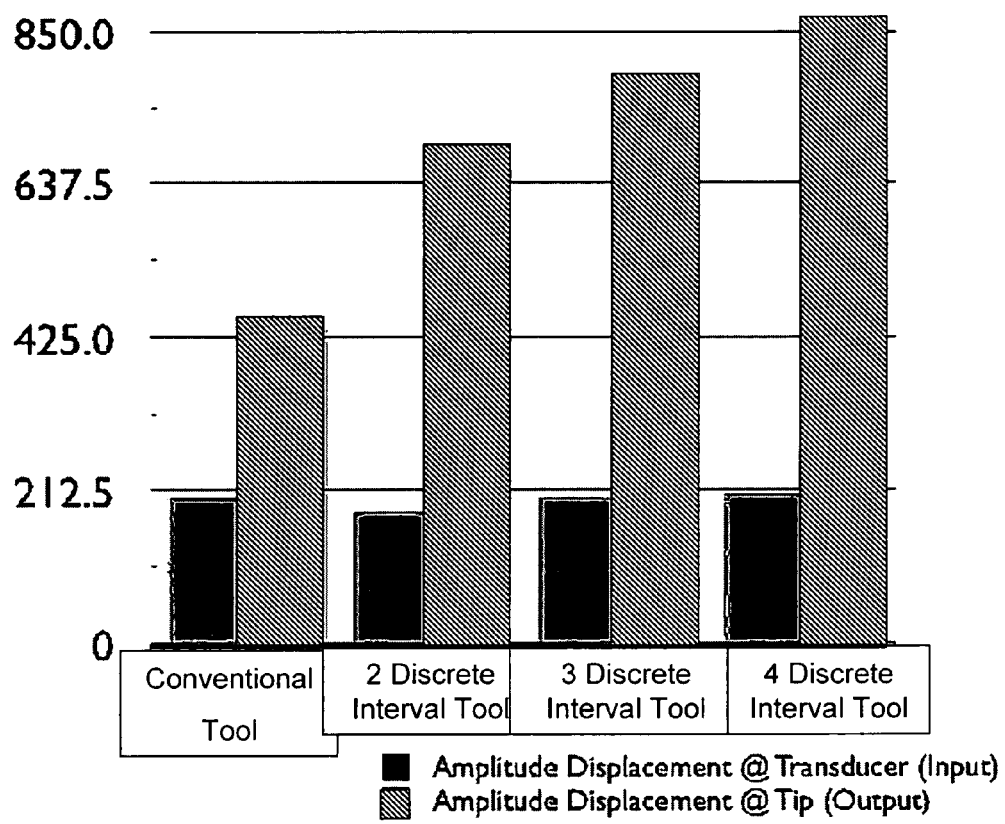
FIG. 9 shows a bar chart comparing the displacement of the conventional bonding tool of FIG. 1 against bonding tools (FIGS. 2, 3, and 4) having a plurality of discrete intervals.

FIG. 9 shows a bar chart that compares the conventional bonding tool of FIG. 1 against the multiple discrete intervals bonding tools of the embodiments of FIGS. 2, 3 and 4 and a an embodiment having four discrete intervals (not shown). A laser interferometer is used to measure the displacement of the tip. The table of FIG. 10 shows the actual values of the displacement by comparison between the aforesaid various bonding tools, which will be further discussed below. Graphically, the displacement of the tip of the bonding tools according to the present invention (FIGS. 2, 3, and 4) is significantly higher than that of the conventional bonding tool. It should be noted that the higher displacement of the tips is achieved while providing an input similar to that received by the conventional bonding tool.

FIG. 10 shows a table of the amplitude displacement reading of bonding tools as tested in FIG. 9. The table is a detailed result from the laser interferometer test done in FIG. 9 and clearly shows the amplitude displacement at the tips of the bonding tools according to the present invention (FIGS. 2, 3, and 4) at about a 600 nm level of reading while the input from the transducer was about the 200 nm range, even for the conventional bonding tool. Generally, the amplitude displacement ratio ranges between about 3.00-3.70 while that of the conventional tool is about 2.22.

The amplification ratio is calculated by dividing the displacement of tip by the displacement at the transducer. The amplification ratios of bonding tools according to the present invention are at least about a third greater than that of the conventional bonding tool. The combination of high amplitude displacement at the tip ($\geq 600$ nm) and an amplification ratio value greater than three of the bonding tool implies that the ultrasonic power to drive the capillary may be lowered to achieve a tip displacement equivalent to that of the present conventional bonding tool. Having a lower ultrasonic input energy level aids in the formation of reliable bonds for sensitive bond pad metallization like the low-K value material, for example.

The significance of the bonding tools of the present invention having a high amplification ratio is essentially that less input energy is needed in order to achieve a tip displacement equivalent to that of conventional bonding tools. In other words, a displacement equivalent to that of conventional bonding tools may be achieved by inputting less energy than that required by the conventional bonding tool. In this connection, when bonding materials having low-K values, the utilization of less energy makes the bond pad less susceptible to metal lifting, metal peel off and cratering.

Figure 11A:
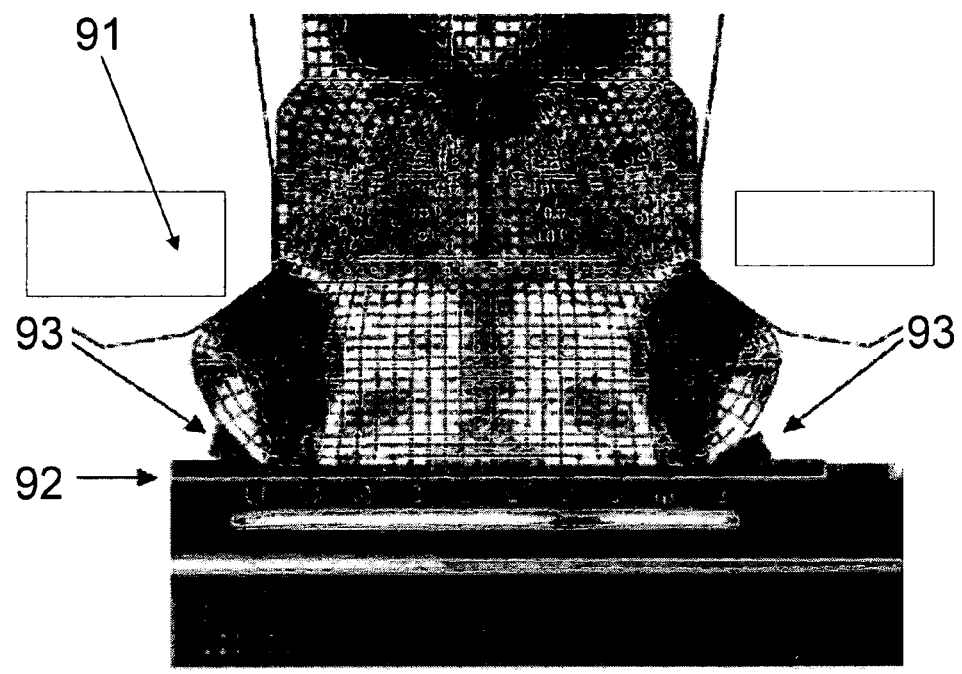
FIG. 11A shows the cross-sectional view of a ball bond as produced by a conventional bonding tool.

FIG. 11A shows the cross-sectional view of a ball bond with excessive aluminum extrusion using the conventional bonding tool of FIG. 1. The photograph shows the cross-sectional view of the ball bonded using the conventional capillary 100. It is observed that there is an excessive aluminum extrusion around the periphery of the ball bond in the bond pad. This causes internal voids that may result in lifted metal or metal peeling problems. The excessive aluminum extrusion of the ball bond consumes the aluminum material when subjected to baking for five hours at 175 degree Celsius, which simulates the mold curing effect on the Au—Al intermetallic layer.

Figure 11B:
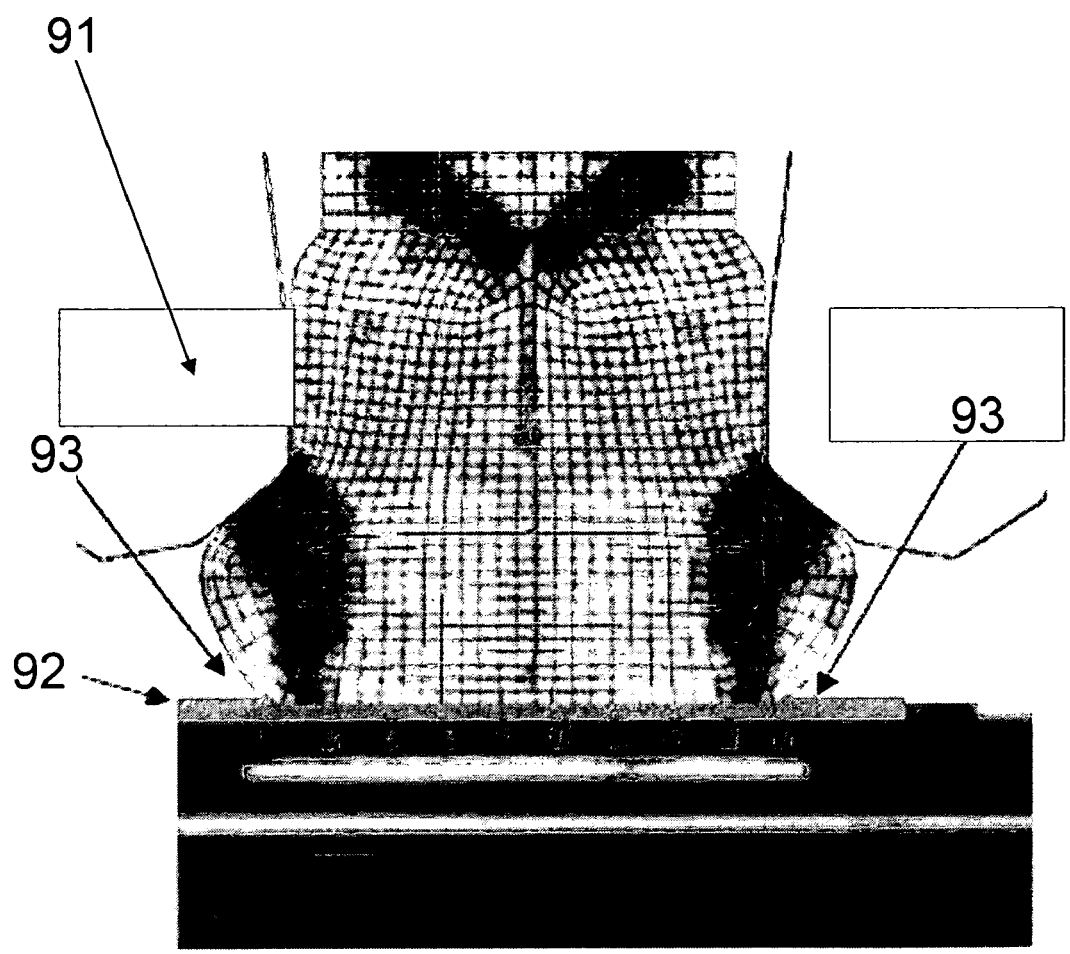
FIG. 11B shows the cross-sectional view of a ball bond as produced by a bonding tool having two discrete intervals.

FIG. 11B shows the cross-sectional view of a ball bond without excessive aluminum extrusion using the bonding tool of FIGS. 2, 3 and 4. One advantage of the bonding tool of FIGS. 2, 3, and 4 over the conventional bonding tool is shown in FIG. 11B, which shows the cross-sectional view of the ball-bonded unit without the excessive aluminum extrusion. The absence of excessive aluminum extrusion around the periphery of the ball bond makes the ball bond robust in terms of improved bonding adhesion reliability without bond lift-offs. Again, as above, the ball bond had undergone an exposure of five hours at 175 degree Celsius to simulate the mold-curing effect on the Au—Al intermetallic layer.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A bonding tool for bonding a fine wire to a substrate, said bonding tool comprising:
    a first substantially cylindrical portion having a first latitudinal cross-sectional average width and a length, wherein the first latitudinal cross-sectional average width is substantially constant along the length of the first substantially cylindrical portion;
    a second substantially cylindrical portion adjacent to the first substantially cylindrical portion and having a second latitudinal cross-sectional average width and a length, wherein the second latitudinal cross-sectional average width is substantially constant along the length of the second substantially cylindrical portion, and the second latitudinal cross-sectional average width is smaller than the first latitudinal cross-sectional average width;
    a third cylindrical portion adjacent to the second substantially cylindrical portion and having a third latitudinal cross-sectional average width and a length, wherein the third latitudinal cross-sectional average width is substantially constant along the length of the third cylindrical portion, and the third latitudinal cross-sectional average width is smaller than the second latitudinal cross-sectional average width; and
    a working tip portion having a length and a width adjacent to an end of the third substantially cylindrical portion and being tapered toward a tip of the working tip portion, said working tip portion having an annular chamfer at the tip thereof;
    wherein each of the first, second, and third substantially cylindrical portion defines therein a concentric capillary through which the fine wire runs;
    wherein the concentric capillary opens into the annular chamfer of the working tip; and
    wherein the first substantially cylindrical portion transitions to the second substantially cylindrical portion at a first discrete interval, and the second substantially cylindrical portion transitions to the third substantially cylindrical portion at a second discrete interval alone a length of the bonding tool.

2. The bonding tool according to claim 1, further comprising a fourth substantially cylindrical portion having a fourth latitudinal cross-sectional average width that is substantially constant along the length of the fourth substantially cylindrical portion, wherein the fourth substantially cylindrical portion is adjacent to the first substantially cylindrical portion, the fourth latitudinal cross-sectional average width is larger than the first latitudinal cross-sectional average width, and the fourth substantially cylindrical portion transitions to the first substantially cylindrical portion at a third discrete interval.

3. The bonding tool according to claim 1, wherein each of the first discrete interval and the second discrete interval comprises at least one of a step and a tapering toward a longitudinal central axis of rotation of the bonding tool.

4. The bonding tool according to claim 1, wherein each of the first discrete interval and the second discrete interval comprises an essentially ninety degree step, a plurality of tapers, or an arc.

5. The bonding tool according to claim 1, wherein each of the first discrete interval and the second discrete interval comprises a tapering that is angled up to 10 degrees toward a longitudinal central axis of rotation of the bonding tool.

6. The bonding tool according to claim 1, wherein at least one of the first cylindrical portion, the second cylindrical portion, and the third cylindrical portion has a length of at least about 2.65 mm.

7. The bonding tool according to claim 1, wherein the lengths of the first substantially cylindrical portion, the second substantially cylindrical portion, and the third substantially cylindrical portion are substantially equal.

8. The bonding tool according to claim 1, wherein the first discrete interval is distant from the working tip by about 7.10 mm, and the second discrete interval is distant from the working tip by about 2.65 mm.

9. The bonding tool according to claim 1, wherein the any of the first substantially cylindrical portion, the second substantially cylindrical portion, and the third substantially cylindrical portion has a latitudinal cross-section that is polygonal, circular, or elliptical.

10. The bonding tool according to claim 1, wherein any of the first substantially cylindrical portion, the second substantially cylindrical portion, and the third substantially cylindrical portion has a substantially constant latitudinal cross-section that is pentagonal in shape, hexagonal in shape, or octagonal in shape.

11. The bonding tool according to claim 1, wherein the combination of the first substantially cylindrical portion, the second substantially cylindrical portion, the third substantially cylindrical portion, and the working tip is adapted to undergo an ultrasonic displacement when ultrasonic energy is transmitted to the bonding tool.

12. The bonding tool according to claim 11, wherein the working tip portion has a displacement amplification ratio of at least about three when undergoing ultrasonic displacement.

13. The bonding tool according to claim 11, wherein the ultrasonic displacement of the combination of the first substantially cylindrical portion, the second substantially cylindrical portion, the third substantially cylindrical portion, and the working tip is substantially sinusoidal.

14. The bonding tool according to claim 1, wherein the length of the concentric capillary and annular chamfer is between about 9.00 mm to about 20.00 mm.

15. The bonding tool according to claim 1, wherein the concentric capillary has a diameter between about 80 μm and about 5.0 mm, inclusive.

16. The bonding tool according to claim 1, wherein the concentric capillary is made from a material selected from the group consisting of a metal, a ceramic, and/or a ceramic-metallic (CerMet) composite.

17. The bonding tool according to claim 16, wherein the concentric capillary is made from a metal, and the metal is selected from the group consisting of nickel, titanium molybdenum, and cobalt.

18. The bonding tool according to claim 16, wherein the concentric capillary is made from a ceramic, and the ceramic is selected from the group consisting of oxides, carbides, nitrides, and borides.

19. The bonding tool according to claim 16, wherein the concentric capillary is made from a CerMet composite, and the CerMet composite is selected from the group consisting of cobalt bonded tungsten carbide, titanium carbonitride, and titanium nitride.

20. A method for bonding a wire to a substrate having a bond pad or leadframe including use of the bonding tool according to claim 1, the method comprising:
  feeding a wire through the concentric capillary to exit the tip of the working tip portion; and
  applying ultrasonic energy to the bonding tool to cause wire exiting the tip of the working tip portion to bond with the bond pad or leadframe.

21. The method according to claim 20, wherein the bond pad or leadframe comprises a metal-containing bond pad, and the application of ultrasonic energy to the bonding tool causes wire exiting the tip of the working tip portion to be inter-diffused with metal of the metal-containing bond pad.

22. A bonding device for forming a metallurgical bond between a fine wire to a substrate, said bonding device comprising:
  (i) a bonding tool for bonding a fine wire to a substrate, said bonding tool comprising:
    a first substantially cylindrical portion having a first latitudinal cross-sectional average width and a length, wherein the first latitudinal cross-sectional average width is substantially constant along the length of the first substantially cylindrical portion;
    a second substantially cylindrical portion adjacent to the first substantially cylindrical portion and having a second latitudinal cross-sectional average width and a length, wherein the second latitudinal cross-sectional average width is substantially constant along the length of the second substantially cylindrical portion, and the second latitudinal cross-sectional average width is smaller than the first latitudinal cross-sectional average width;
    a third cylindrical portion adjacent to the second substantially cylindrical portion and having a third latitudinal cross-sectional average width and a length, wherein the third latitudinal cross-sectional average width is substantially constant along the length of the third cylindrical portion, and the third latitudinal cross-sectional average width is smaller than the second latitudinal cross-sectional average width; and
    a working tip portion having a length and a width adjacent to an end of the third substantially cylindrical portion and being tapered toward a tip of the working tip portion, said working tip portion having an annular chamfer at the tip thereof;
    wherein each of the first, second, and third substantially cylindrical portion defines therein a concentric capillary through which the fine wire runs;
    wherein the concentric capillary opens into the annular chamfer of the working tip; and
    wherein the first substantially cylindrical portion transitions to the second substantially cylindrical portion at a first discrete interval, and the second substantially cylindrical portion transitions to the third substantially cylindrical portion at a second discrete interval along a length of the bonding tool; and
  (ii) a nano-scale ultrasonic energy source connected to said bonding tool to transmit ultrasonic energy to the bonding tool.

23. The bonding device according to claim 22, wherein the length of the concentric capillary and annular chamfer is between about 9.00 mm to about 20.00 mm.

24. The bonding device according to claim 22, wherein the concentric capillary is made from a material selected from the group consisting of a metal, a ceramic, and/or a ceramic-metallic (CerMet) composite.

25. The bonding device according to claim 22, wherein the bonding tool comprises a fourth substantially cylindrical portion having a fourth latitudinal cross-sectional average width that is substantially constant along the length of the fourth substantially cylindrical portion, wherein the fourth substantially cylindrical portion is adjacent to the first substantially cylindrical portion, the fourth latitudinal cross-sectional average width is larger than the first latitudinal cross-sectional average width, and the fourth substantially cylindrical portion transitions to the first substantially cylindrical portion at a third discrete interval.

26. The bonding device according to claim 22, wherein the combination of the first substantially cylindrical portion, the second substantially cylindrical portion, the third substantially cylindrical portion, and the working tip is adapted to undergo an ultrasonic displacement when ultrasonic energy is transmitted to the bonding tool.

\* \* \* \* \*